United States Patent
Pan et al.

(10) Patent No.: US 9,620,465 B1
(45) Date of Patent: Apr. 11, 2017

(54) DUAL-SIDED INTEGRATED FAN-OUT PACKAGE

(71) Applicant: Taiwan Semiconductor Manufacturing Company, Ltd., Hsin-Chu (TW)

(72) Inventors: Kuo Lung Pan, Hsin-Chu (TW); Wei Sen Chang, Jinsha Township (TW); Tin-Hao Kuo, Hsin-Chu (TW); Hao-Yi Tsai, Hsin-Chu (TW); Chung-Shi Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/005,547

(22) Filed: Jan. 25, 2016

(51) Int. Cl.
H01L 23/00 (2006.01)
H01L 23/495 (2006.01)
H01L 25/065 (2006.01)
H01L 23/498 (2006.01)
H01L 23/31 (2006.01)
H01L 21/48 (2006.01)
H01L 21/56 (2006.01)

(52) U.S. Cl.
CPC .......... *H01L 24/02* (2013.01); *H01L 21/4825* (2013.01); *H01L 21/56* (2013.01); *H01L 23/3114* (2013.01); *H01L 23/49506* (2013.01); *H01L 23/49579* (2013.01); *H01L 23/49827* (2013.01); *H01L 25/065* (2013.01); *H01L 2224/0231* (2013.01); *H01L 2224/0239* (2013.01); *H01L 2224/02372* (2013.01); *H01L 2224/02373* (2013.01); *H01L 2224/02379* (2013.01)

(58) Field of Classification Search
CPC .............. H01L 24/02; H01L 23/49579; H01L 23/49506; H01L 25/065; H01L 23/49827; H01L 23/3114; H01L 21/4825; H01L 21/56
See application file for complete search history.

(56) References Cited

U.S. PATENT DOCUMENTS

| | | |
|---|---|---|
| 8,361,842 B2 | 1/2013 | Yu et al. |
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 2011/0291288 A1 | 12/2011 | Wu et al. |

(Continued)

*Primary Examiner* — Long Pham
(74) *Attorney, Agent, or Firm* — Slater Matsil, LLP

(57) ABSTRACT

A method for forming through vias comprises the steps of forming a dielectric layer over a package and forming an RDL over the dielectric layer, wherein forming the RDL includes the steps of forming a seed layer, forming a first patterned mask over the seed layer, and performing a first metal plating. The method further includes forming through vias on top of a first portion of the RDL, wherein forming the through vias includes forming a second patterned mask over the seed layer and the RDL, and performing a second metal plating. The method further includes attaching a chip to a second portion of the RDL, and encapsulating the chip and the through vias in an encapsulating material.

19 Claims, 5 Drawing Sheets

(56) References Cited

U.S. PATENT DOCUMENTS

| | | |
|---|---|---|
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0307140 A1 | 11/2013 | Huang et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |

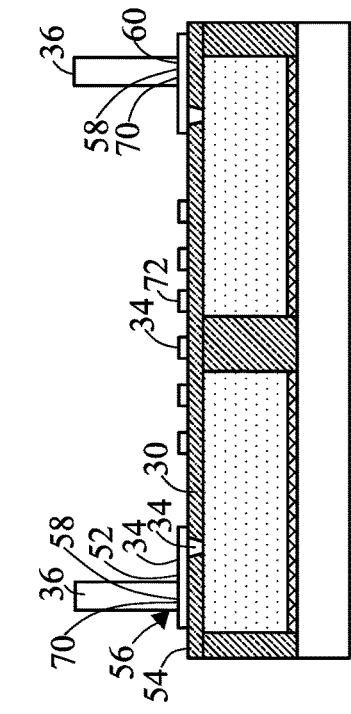
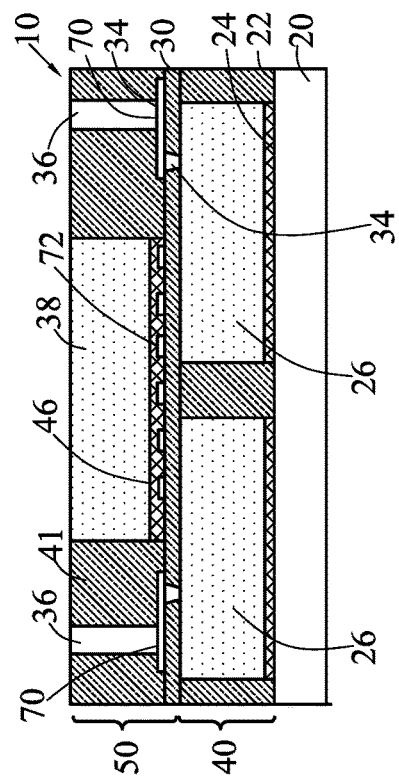
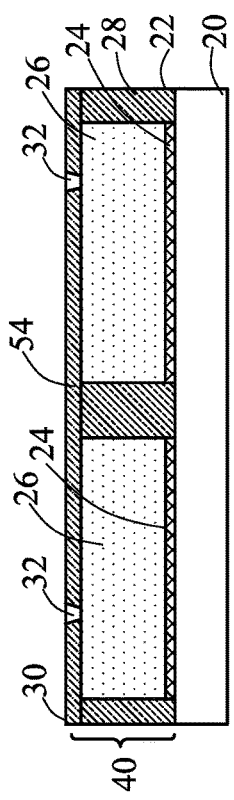
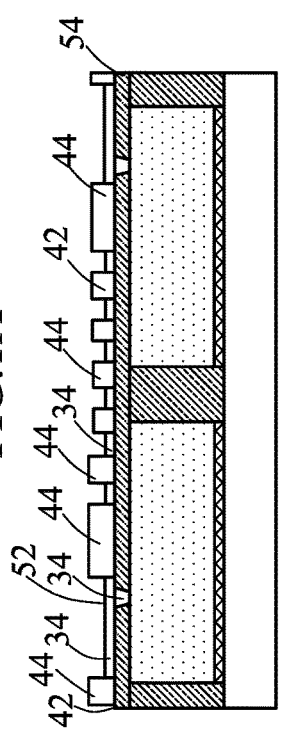
FIG.1A FIG.1B FIG.1C FIG.1D FIG.1E

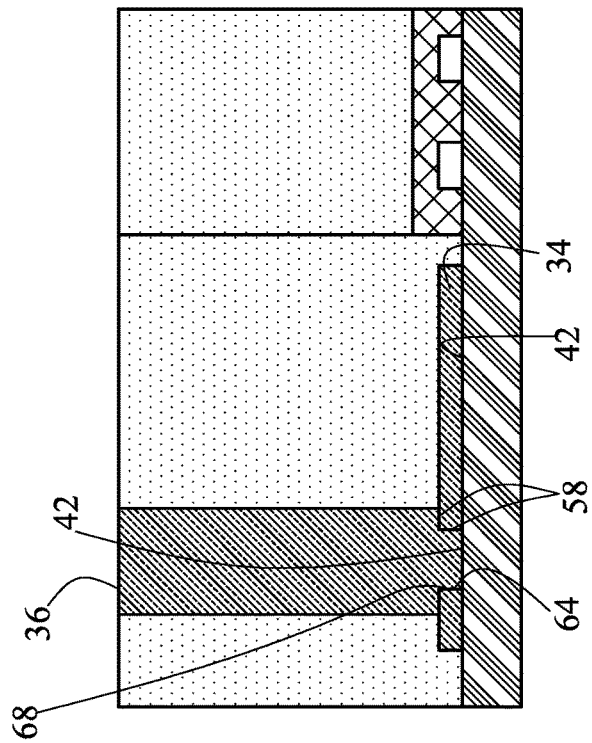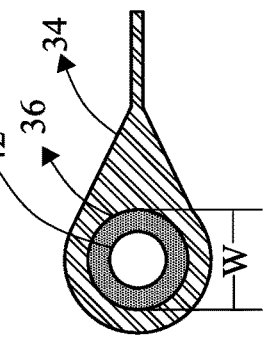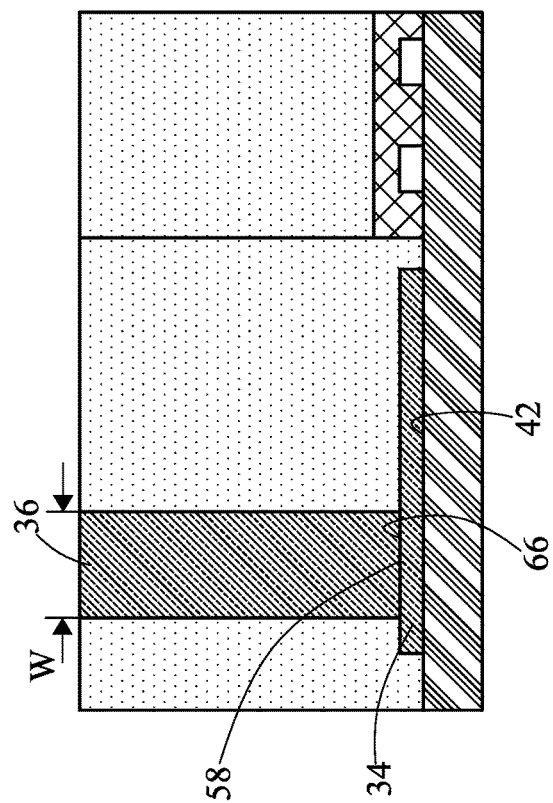

US 9,620,465 B1

DUAL-SIDED INTEGRATED FAN-OUT PACKAGE

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. The sizes of the dies are becoming increasingly smaller and the respective packages can typically only be fan-in type packages, for which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged. An advantageous feature of this packaging technology is the possibility of forming fan-out packages, which means the I/O pads on a die can be redistributed to a greater area than the die, and hence the number of I/O pads packed on the surfaces of the dies can be increased. Another advantageous feature of this packaging technology is that "known-good-dies" are packaged, and defective dies are discarded, and hence cost and effort are not wasted on the defective dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A through 2D are cross-sectional views of intermediate stages in the manufacturing of packages in accordance with some embodiments.

FIG. 3 is a detailed, cross-sectional view of a through via in accordance with some embodiments.

FIG. 4 is a detailed, cross-sectional view of a through via in accordance with some embodiments.

FIG. 5 is a top view of a through via and a portion of an RDL layer in accordance with some embodiments.

FIG. 6 is a top view of a through via and a portion of an RDL layer in accordance with some embodiments.

DETAILED DESCRIPTION

Figure 2D:
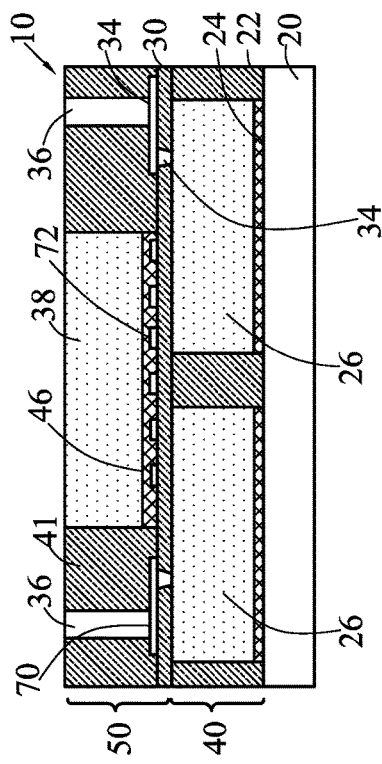

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the package are provided in accordance with various exemplary embodiments. The variations of the embodiments are discussed. Throughout the various views and illustrative embodiments, like reference numbers are used to designate like elements.

FIGS. 1 through 6 illustrate the cross-sectional views and top views of intermediate stages in the manufacturing of a dual-sided package 10 in accordance with embodiments. In some embodiments, the dual-sided package 10 has an integrated fan-out architecture. The steps shown in FIGS. 1A through 1E are illustrated schematically in the process flow 300 shown in FIG. 7 and the steps shown in FIGS. 2A through 2D are illustrated schematically in the process flow 400 shown in FIG. 8. In the subsequent discussion, the process steps shown in FIGS. 1A through 2D are discussed, referring to the process steps in FIG. 7 and FIG. 8, respectively.

FIGS. 1A-1E illustrate cross-sectional views of intermediate stages in the manufacturing of the dual-sided package 10 in accordance with some embodiments. The dual-sided package 10 is formed on a carrier 20. A release layer 22 is formed on the carrier 20 so that the dual-sided package 10 may later be removed from the carrier 20. The carrier 20 may be a glass carrier, a ceramic carrier, or the like. The carrier 20 may have a round top-view shape and may be a size of a silicon wafer. For example, the carrier 20 may have a 200 mm diameter, a 300 mm diameter, or the like. The release layer 22 may be formed of a polymer-based material (such as a Light To Heat Conversion (LTHC) material), which may be removed along with the carrier 20 from the overlying structures that will be formed in subsequent steps. In accordance with some embodiments of the present disclosure, the release layer 22 is formed of an epoxy-based thermal-release material. In other embodiments, the release layer 22 is formed of an ultra-violet (UV) glue. The release layer 22 may be dispensed as a liquid and cured. In alternative embodiments, the release layer 22 is a laminate film and is laminated onto the carrier 20. A top surface of the release layer 22 is leveled and has a high degree of coplanarity.

A dielectric layer (not shown) may be formed on the release layer 22. In accordance with some embodiments of the present disclosure, the dielectric layer is formed of a polymer, which may also be a photo-sensitive material such as polybenzoxazole (PBO), polyimide, benzocyclobutene (BCB), or the like, that may be easily patterned using a photo lithography process. In alternative embodiments, the dielectric layer is formed of a nitride such as silicon nitride, an oxide such as silicon oxide, PhosphoSilicate Glass (PSG), BoroSilicate Glass (BSG), Boron-doped PhosphoSilicate Glass (BPSG), or the like.

One or more first level device dies 26 are positioned on the dielectric layer. While FIGS. 1A-1E illustrate two first level device dies 26, it should be appreciated that there may be any number of first level device dies 26 positioned on the dielectric layer. In some embodiments there may be only one first level device dies 26. In yet other embodiments, there may be more than two first level device dies 26. Each of the first level device dies 26 may be a logic device die including logic transistors therein. In some embodiments, the first level device dies 26 may include a central processing unit (CPU) die or a graphic processing unit (GPU) die. In accordance with some exemplary embodiments, each of the first level device dies 26 is a die designed for mobile applications and may be a Power Management Integrated Circuit (PMIC) die, a Transceiver (TRX) die, or the like.

An encapsulating material 28 encapsulates the first level device dies 26. In some embodiments, the encapsulating material 28 may be a molding material. In yet some embodiments, the encapsulating material 28 may include a molding compound, a molding underfill, an epoxy, and/or a resin.

In a subsequent step (not illustrated), a planarization such as a Chemical Mechanical Polish (CMP) step or a grinding step may be performed on the encapsulating material 28 until a top surface of the first level device dies 26 is coplanar with a top surface of the encapsulating material 28.

Still referring to FIGS. 1A-1E, the first level device dies 26 and encapsulating material 28 form a first portion 40 or a first sub-package of the dual-sided package 10 (shown in FIG. 1E). On top of the first portion 40 of the dual-sided package 10, a second portion 50 or a second sub-package is formed. The second portion 50 of the dual-sided package 10 includes a dielectric layer 30, a redistribution layer (RDL) 34, through vias 36, a second level device die 38 and an encapsulating material 41. In an embodiment, the first portion 40 and the second portion 50 form the dual-sided package 10.

Referring now primarily to FIG. 1A, the dielectric layer 30, which is part of the second portion 50 of the dual-sided package 10, is formed on top of the encapsulating material 28. The respective step is shown as step 302 in the process flow shown in FIG. 7. In accordance with some embodiments of the present disclosure, the dielectric layer 30 is formed of a polymer, which may also be a photo-sensitive material such as polybenzoxazole (PBO), polyimide, benzocyclobutene (BCB), or the like, that may be easily patterned using a photo lithography process. In alternative embodiments, the dielectric layer 30 is formed of a nitride such as silicon nitride, an oxide such as silicon oxide, PhosphoSilicate Glass (PSG), BoroSilicate Glass (BSG), Boron-doped PhosphoSilicate Glass (BPSG), or the like.

The dielectric layer 30 is then patterned to form openings 32 therein. Hence, some portions of the first level device dies 26 are exposed through the openings 32 in the dielectric layer 30 to provide an electrical contact to the first level device dies 26.

Referring to FIG. 1B, a redistribution layer (RDL) 34 is formed over the dielectric layer 30. The respective step is shown as step 304 in the process flow shown in FIG. 7. The formation of the RDL 34 may include forming a seed layer 42 over the dielectric layer 30, forming a first patterned mask 44, such as a photo resist, over the seed layer 42, and then performing a first metal plating (not shown) on the exposed portions of the seed layer 42. The RDL 34 is formed according to the first patterned mask 44. In some embodiments (see FIGS. 4 and 6), a portion of the RDL 34 upon which a through via is later formed may include an aperture formed therein, such that the aperture extends through the entirety of the RDL 34 from top to bottom. This feature will be discussed in more detail below.

In an embodiment, the RDL 34 is formed of copper. In yet other embodiments, the RDL 34 may be formed of tungsten tantalum, copper, aluminum, nickel, titanium, alloys thereof, or multi-layers thereof. In accordance with some embodiments of the present disclosure, the seed layer 42 includes a titanium layer and a copper layer over the titanium layer. The seed layer may be formed using, for example, Physical Vapor Deposition (PVD). The plating may be performed using, for example, electro-less plating.

After the RDL 34 is formed over the dielectric layer 30, the first patterned mask 44 is then removed, leaving the RDL 34 and the seed layer 42 as illustrated in FIG. 1C. The respective step is shown as step 306 in the process flow shown in FIG. 7. The RDL 34 is positioned above the dielectric layer 30. In some aspects, an upper surface 52 of the RDL is above an upper most surface 54 of the dielectric layer 30.

Referring to FIG. 1D, through vias or metal posts 36 are formed over or on the RDL 34 and electrically coupled to the RDL 34. In an embodiment, the through vias 36 are formed on a first portion 70 of the RDL 34. Throughout the description, the through vias 36 may alternatively be referred to as the metal posts 36 since the metal posts 36 penetrate through the subsequently formed encapsulating material. In accordance with some embodiments of the present disclosure, the through vias 36 are formed by forming a second patterned mask (not shown) over the RDL 34 and performing a second metal plating (not shown). The respective step is shown as step 308 in the process flow shown in FIG. 7. The through vias 36 are used for electrically inter-coupling features on the opposite ends of through vias 36. The plating of through vias 36 may include forming and patterning a photo resist (second patterned mask), and plating the through vias 36 on the portions of the RDL 34 that are exposed through the openings in the photo resist. The second photo resist is then removed. An etch is then applied to remove exposed portions of the seed layer 42 after the second patterned mask is removed. The respective step is shown in step 310 in the process flow shown in FIG. 7.

The through vias 36 are formed directly on the RDL 34 after the first patterned mask 44 has been removed. The point at which the through vias 36 and the RDL 34 join may be referred to as a joint 58. In an embodiment, the dielectric layer 30 is positioned below the through vias 36. In some aspects, there is no dielectric layer surrounding a bottom portion 56 of the through vias 36 that is attached or otherwise connected to the upper surface 52 of the RDL 34 by means of the joint 58. As previously mentioned, in some embodiments, the upper surface 52 of the RDL 34 is higher than or above the upper most surface 54 of the dielectric layer 30. Thus, the through vias 36, in such an embodiment, are also above the upper most surface 54 of the dielectric layer 30.

The material of the through vias 36 may include copper, aluminum, or the like. In some embodiments, both the RDL 34 and the through vias 36 are comprised of copper. In yet some embodiments, both the RDL 34 and the through vias 36 are comprised of copper with no intervening metals or adhesives (for example, a titanium adhesive) positioned between the RDL 34 and the through vias 36. The material used to form the RDL 34 and the through vias 36 and or the structural configuration of the joint 58 provides for a sufficiently strong enough bond or joint 58 that an intervening metal adhesive is not needed.

In other embodiments, the through vias 36 may be replaced by or used in conjunction with conductive studs or conductive wires (not shown) that electrically couple the dies to metallization layers.

In an embodiment, the through vias 36 have the shape of rods. The top-view shapes of the through vias 36 may be circles, rectangles, squares, hexagons, or the like. In accordance with some embodiments of the present disclosure, the through vias 36 are arranged to align to a ring or rectangle encircling a region therein, wherein the region is used for placing a second level device die 38, as illustrated in FIG. 1E.

FIG. 1E illustrates the placement of the second level device die 38. The respective step is shown as step 312 in the process flow shown in FIG. 7. The second level device die 38 is adhered to the dielectric layer 30 through a die-attach film (DAF) 46, which is an adhesive film, and/or a second portion 72 of the RDL 34. The second level device die 38 may be a logic device die including logic transistors therein. In accordance with some exemplary embodiments, the second level device die 38 is a die designed for mobile applications and may be a Power Management Integrated Circuit (PMIC) die, a Transceiver (TRX) die, or the like. Although only one second level device die 38 is illustrated, more device dies may be placed over the dielectric layer 30. The second level device die 38 may be similar or the same as the first level device dies 26.

The encapsulating material 41 encapsulates the second level device die 38 and the through vias 36. The respective step is shown as step 314 in the process flow shown in FIG. 7. The encapsulating material 41 fills the gaps between the through vias 36 and the gaps between the through vias 36 and the second level device die 38. The encapsulating material 41 may be a molding material and may include a molding compound, a molding underfill, an epoxy, and/or a resin.

In a subsequent step (not shown), a planarization such as a Chemical Mechanical Polish (CMP) step or a grinding step may be performed on the encapsulating material 41 until the through vias 36 are exposed. Due to the grinding, the top ends of through vias 36 are substantially level (coplanar) with the top surface of encapsulating material 41.

FIGS. 2A-2E illustrate cross-sectional views of intermediate stages in the manufacturing of the dual-sided package 10 in accordance with some embodiments. The dual-sided package 10 is formed on the carrier 20. The release layer 22 is formed on the carrier 20 so that the dual-sided package 10 may later be removed from the carrier 20. The one or more first level device dies 26 may be positioned on the dielectric layer (not shown). While FIGS. 2A-2D illustrate two first level device dies 26, it should be appreciated that there may be any number of first level device dies 26 positioned on the dielectric layer. In some embodiments there may be one first level device dies. In yet some embodiments, there may be more than two first level device dies. Each of the first level device dies 26 may be a logic device die including logic transistors therein. In accordance with some exemplary embodiments, the first level device dies 26 is a die designed for mobile applications and may be a Power Management Integrated Circuit (PMIC) die, a Transceiver (TRX) die, or the like.

The encapsulating material 28 encapsulates the first level device dies 26. In a subsequent step (not illustrated), a planarization such as a Chemical Mechanical Polish (CMP) step or a grinding step may be performed on the encapsulating material 28 until a top surface of the first level device dies 26 is coplanar with a top surface of the encapsulating material 28.

The first level device dies 26 and the encapsulating material 28 form the first portion 40 or a first sub-package of the dual-sided package 10 (shown in FIG. 2D). On top of the first portion 40 of the dual-sided package 10, the second portion 50 or the second sub-package is formed. The second portion 50 of the dual-sided package 10 includes the dielectric layer 30, the RDL 34, the through vias 36, the second level device die 38 and the encapsulating material 41. In an embodiment, the first portion 40 and the second portion 50 form the dual-sided package 10.

Figure 2A:
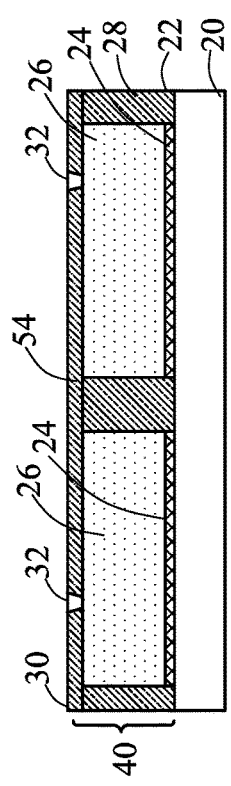

Referring now primarily to FIG. 2A, the dielectric layer 30, which is part of the second portion 50 of the dual-sided package 10, is formed on top of the encapsulating material 28. The respective step is shown as step 402 in the process flow shown in FIG. 8. In accordance with some embodiments of the present disclosure, the dielectric layer 30 is formed of a polymer, which may also be a photo-sensitive material such as polybenzoxazole (PBO), polyimide, benzocyclobutene (BCB), or the like, that may be easily patterned using a photo lithography process. In alternative embodiments, the dielectric layer 30 is formed of a nitride such as silicon nitride, an oxide such as silicon oxide, PhosphoSilicate Glass (PSG), BoroSilicate Glass (BSG), Boron-doped PhosphoSilicate Glass (BPSG), or the like. The dielectric layer 30 is then patterned to form openings 32 therein. Hence, some portions of the first level device dies 26 are exposed through the openings 32 in the dielectric layer 30.

Figure 2B:
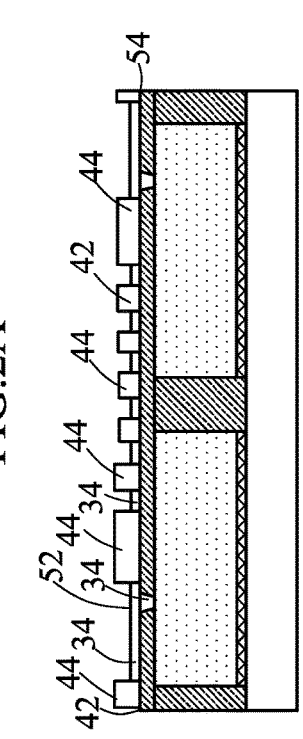

Referring to FIG. 2B, the redistribution layer (RDL) 34 is formed over the dielectric layer 30. The respective step is shown as step 404 in the process flow shown in FIG. 8. The formation of the RDL 34 may include forming the seed layer 42 over dielectric layer 30, forming a first patterned mask 44, such as a photo resist, over the seed layer 42, and then performing a first metal plating (not shown) on the exposed portions of the seed layer 42. The RDL 34 is formed according the first patterned mask 44. In some embodiments (see FIGS. 4 and 6), a portion of the RDL 34 upon which a through via is later formed may include an aperture formed therein, such that the aperture extends through the entirety of the RDL 34 from top to bottom. This feature will be discussed in more detail below.

In an embodiment, the RDL 34 is formed of copper. In yet other embodiments, the RDL 34 may be formed of tungsten tantalum, copper, aluminum, nickel, titanium, alloys thereof, or multi-layers thereof. In accordance with some embodiments of the present disclosure, the seed layer 42 includes a titanium layer and a copper layer over the titanium layer. The seed layer 42 may be formed using, for example, Physical Vapor Deposition (PVD). The plating may be performed using, for example, electro-less plating. The RDL 34 is positioned above the dielectric layer 30. In some aspects, the upper surface 52 of the RDL is above the upper most surface 54 of the dielectric layer 30.

Figure 7:
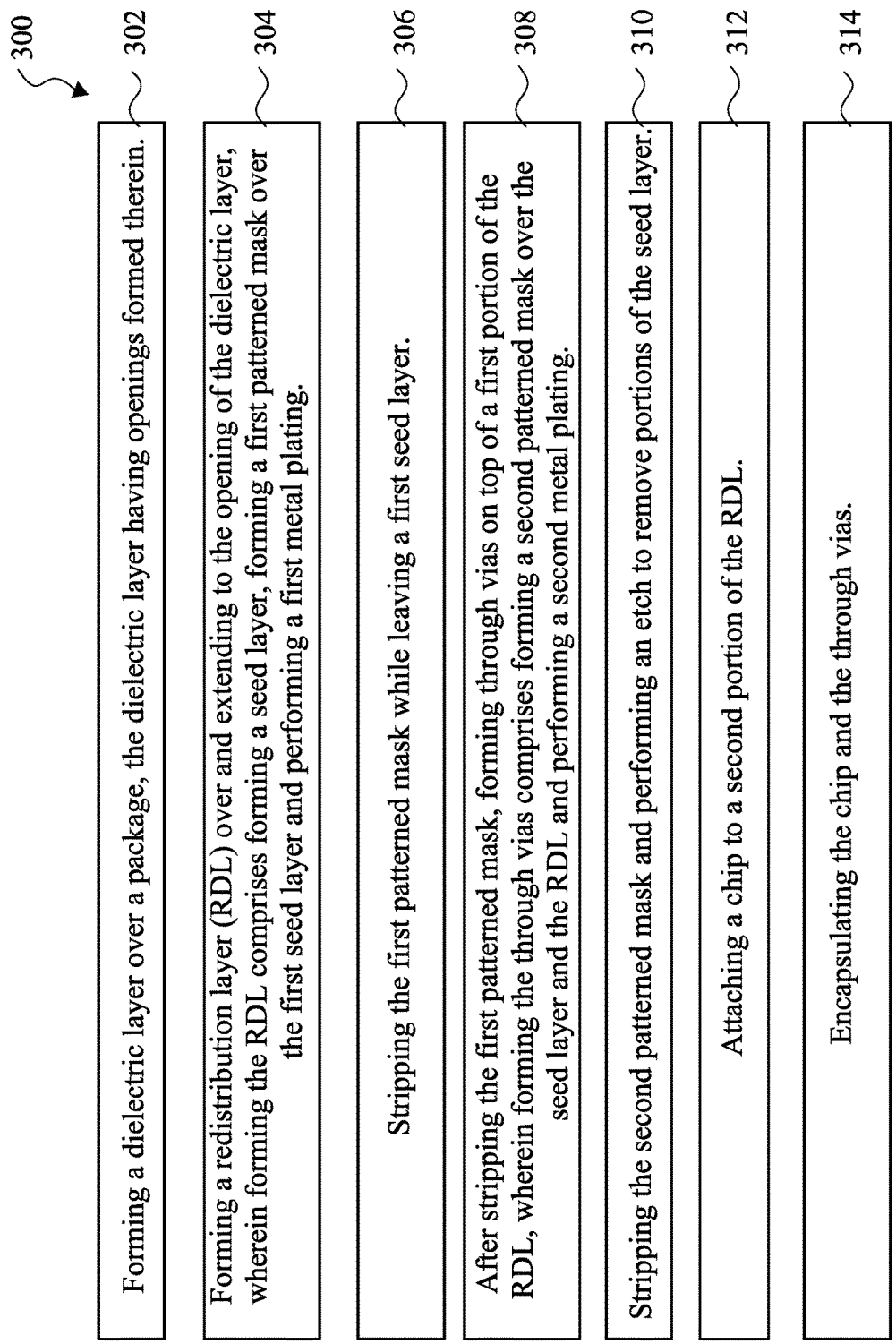
FIG. 7 is a process flow for forming a package in accordance with some embodiments.
Figure 8:
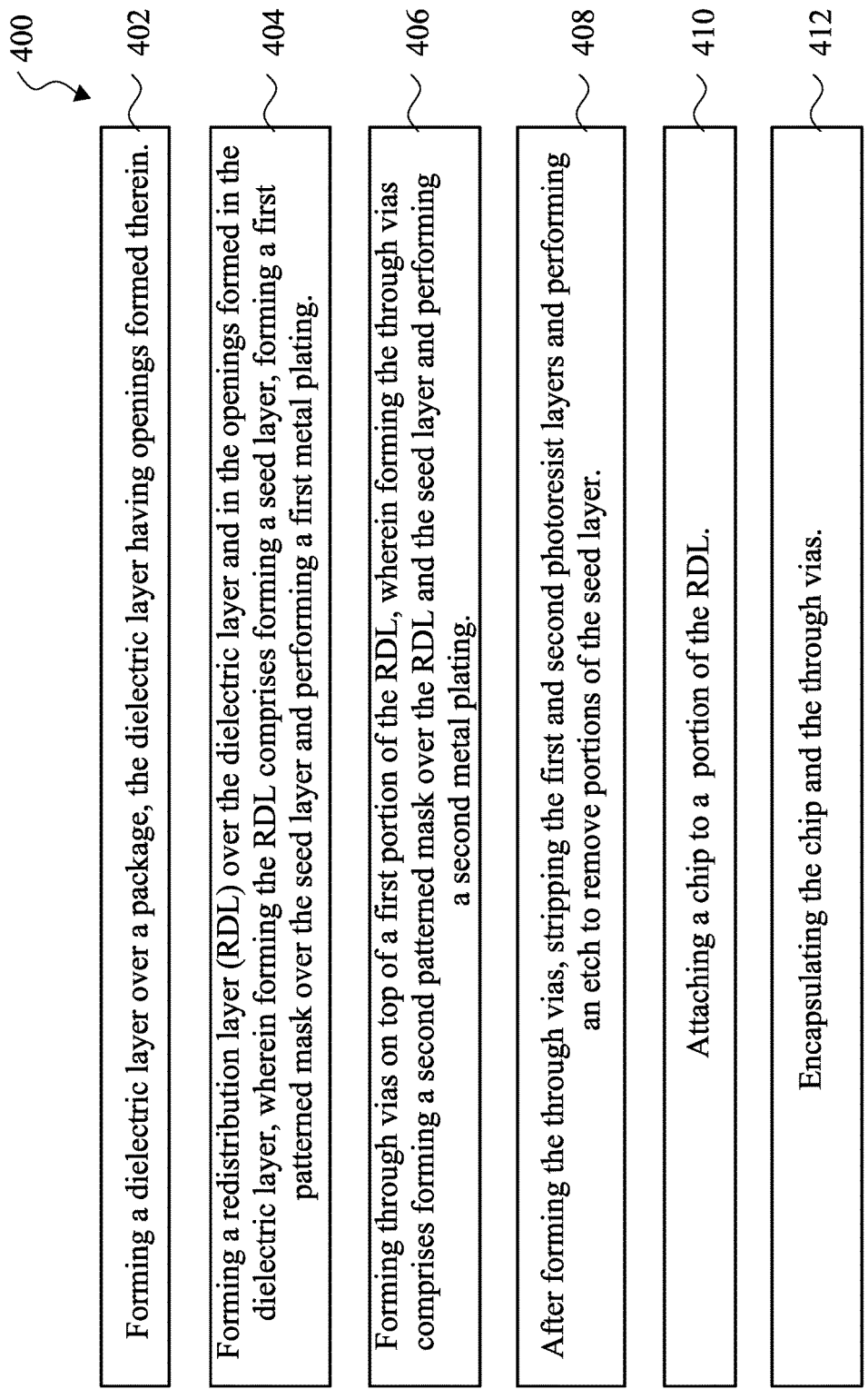
FIG. 8 is a process flow for forming a package in accordance with some embodiments.

In contrast to the process shown as step 306 in FIG. 7 that corresponds to FIG. 1C, the first patterned mask 44 is not removed after the RDL 34 is formed over the dielectric layer 30. Instead, a second patterned mask (not shown) is formed over the first patterned mask 44 and the RDL 34.

Figure 2C:
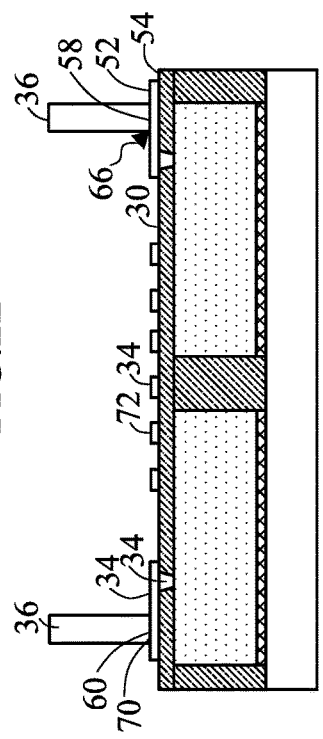

Referring to FIG. 2C, the through vias or metal posts 36 are formed over or on the RDL 34 and electrically coupled to the RDL 34. In an embodiment, the through vias 36 are formed on the first portion 70 of the RDL 34. In accordance with some embodiments of the present disclosure, the through vias 36 are formed by forming a second patterned mask (not shown) over the RDL 34 and the first patterned mask 44. A second metal plating (not shown) is then performed. The respective step is shown as step 406 in the process flow shown in FIG. 8. The through vias 36 are used for electrically inter-coupling features on the opposite ends of through vias 36. The plating of through vias 36 may include forming and patterning a photo resist (second patterned mask), and plating the through vias 36 on the portions of the RDL 34 that are exposed through the openings in the photo resist.

The second patterned mask, the first patterned mask 44 and the seed layer 42 are then removed, leaving the RDL 34 with the through vias 36 formed thereon, as illustrated in FIG. 2C. The respective step is shown as step 408 in the process flow shown in FIG. 8.

The through vias 36 are formed directly on the RDL 34. The point at which the through vias 36 and the RDL 34 join may be referred to as the joint 58. In an embodiment, the dielectric layer 30 is positioned below the through vias 36. In some aspects, there is no dielectric layer surrounding the bottom portion 56 of the through vias 36 that is attached or otherwise connected to the upper surface 52 of the RDL 34 by means of the joint 58. As previously mentioned, in some embodiments, the upper surface 52 of the RDL 34 is higher than or above the upper most surface 54 of the dielectric layer 30. Thus, the through vias 36, in such an embodiment, are also above the upper most surface 54 of the dielectric layer 30.

The material of the through vias 36 may include copper, aluminum, or the like. In some embodiments, both the RDL 34 and the through vias 36 are comprised of copper. In yet some embodiments, both the RDL 34 and the through vias 36 are comprised of copper with no intervening metals or adhesives (for example, a titanium adhesive) positioned between the RDL 34 and the through vias 36. The material used to form the RDL 34 and the through vias 36 provides for a sufficiently strong enough bond or joint 58 that an intervening metal adhesive is not needed.

In an embodiment, the through vias 36 have the shape of rods. The top-view shapes of the through vias 36 may be circles, rectangles, squares, hexagons, or the like. In accordance with some embodiments of the present disclosure, the through vias 36 are arranged to align to a ring or rectangle encircling a region therein, wherein the region is used for placing the second level device die 38, as illustrated in FIG. 2D. A portion 60 of the RDL 34 is free from the second patterned mask. The portion 60 of the RDL 34 that is free from the second patterned mask may be the first portion 70 of the RDL 34. A second metal plating (not shown) is then performed, with the through vias or metal posts 36 being formed directly on the RDL 34 where the portion 60 of the RDL 34 is free from the second patterned mask. It should be appreciated that the portion 60 of the RDL 34 is also free from the first patterned mask 44 as established in the preceding step 404 of FIG. 8.

FIG. 2D illustrates the placement of the second level device die 38. The respective step is shown as step 410 in the process flow shown in FIG. 8. The second level device die 38 is adhered to the dielectric layer 30 through the die-attach film (DAF) 46, which is an adhesive film, and/or the second portion 72 of the RDL 34. The second level device die 38 may be a logic device die including logic transistors therein. In accordance with some exemplary embodiments, the second level device die 38 is a die designed for mobile applications and may be a Power Management Integrated Circuit (PMIC) die, a Transceiver (TRX) die, or the like. Although only one second level device die 38 is illustrated, more device dies may be placed over the dielectric layer 30.

The encapsulating material 41 encapsulates the second level device die 38 and the through vias 36. The respective step is shown as step 412 in the process flow shown in FIG. 8. The encapsulating material 41 fills the gaps between the through vias 36 and the gaps between the through vias 36 and the second level device die 38. The encapsulating material 41 may be a molding material and may include a molding compound, a molding underfill, an epoxy, and/or a resin.

In a subsequent step (not shown), a planarization such as a Chemical Mechanical Polish (CMP) step or a grinding step may be performed on the encapsulating material 41 until the through vias 36 are exposed. Due to the grinding, the top ends of through vias 36 are substantially level (coplanar) with the top surface of encapsulating material 41.

Referring now to FIG. 3, a detailed cross-sectional view of the joint 58 or interface of the RDL 34 and the through vias 36, according to an embodiment, is presented. In an embodiment, the width, w, of the through vias 36 is uniform along is vertical axis, including where the through vias 36 join with the RDL 34. Thus, the joint 58 as exists between the through via 36 and the RDL 34 extends the entire width, w, of the through vias 36 such that a bottom surface 66 of the through vias 36 is the same width as the outer width, w, of the through vias 36, reducing the stress concentration at the joint 58. FIG. 3 further illustrates that the through vias 36 are formed directly on the RDL 34. There are no intervening layers, such as a titanium adhesive, dielectric or passivation layer, positioned between the through vias 36 and the RDL 34. In yet some embodiments, there is no dielectric or passivation layers surrounding or in contact with the through vias 36. In some embodiments, both the through vias 36 and the RDL 34 are formed from the same material. In an illustrative embodiment, both the through vias 36 and the RDL 34 are formed from copper. The joint 58 is sufficiently strong enough that an additional adhesive or bonding means is not needed at the joint 58 for the joint 58 to be structurally fit.

Referring now to FIG. 4, a detailed cross-sectional view of the joint 58 or interface of the RDL 34 and the through vias 36, according to an embodiment, is presented. In an embodiment, the through vias 36 may extend through an aperture 64 formed in the RDL 34 to the underlying seed layer 42. The aperture 64 may be formed during one of the patterned mask processes described above with respect to FIGS. 1A-1E or FIGS. 2A-2D. When the through via 36 is formed, the through via 36 is formed according to the second patterned mask. The through via 36 as shown, is formed both directly on the upper surface 52 of the RDL 34 as well as inside the aperture 64 formed in the RDL 34, along an inside surface 68, which reduces the stress at the joint 58 at least in part due to the larger connecting area at the joint 58. There are no intervening layers, such as a titanium adhesive, dielectric or passivation layer, positioned between the through vias 36 and the RDL 34. In yet some embodiments, there is no dielectric or passivation layers surrounding or in contact with the through vias 36. In some embodiments, both the through vias 36 and the RDL 34 are formed from the same material. In an illustrative embodiment, both the through vias 36 and the RDL 34 are formed from copper. The joint 58 is sufficiently strong enough that an additional adhesive or bonding means is not needed at the joint 58 for the joint 58 to be structurally fit.

FIGS. 5 and 6 show a partial, top view of the through via 36 positioned over the RDL 34, according to some embodiments. The through via 36 has the uniform width, w, and is positioned directly on the RDL 34. FIG. 5 illustrates a solid through via 36. In contrast, FIG. 6 illustrates an embodiment where the through via 36 includes an aperture 62 formed therein. The aperture 62 may extend from a top surface to a bottom surface of the through via 36. In some embodiment, the aperture 62 extends to the seed layer 42 or the dielectric layer 30.

The embodiments of the present disclosure have some advantageous features. By reducing the number of process steps, wafer warping and cost may be reduced. Additionally, positioning the through via directly on the redistribution layer without any intervening dielectric layers may reduce stresses at the joint between the through via and the redistribution layer. Furthermore, different configurations of the through via may further reduce stress. Reducing the stresses at the joint between the through via and the redistribution layer increases the strength of the joint. The reliability of the package is thus improved.

According to an embodiment, a method for forming through vias comprises the steps of forming a dielectric layer over a package and forming RDL over the dielectric layer, wherein forming the RDL includes the steps of forming a seed layer, forming a first patterned mask over the seed layer, and performing a metal plating. The method further includes stripping the first patterned mask but leaving the seed layer and after stripping the RDL, forming through vias on top of a first portion of the RDL, wherein forming the through vias includes forming a second patterned mask over the seed layer and the RDL, and performing a metal plating. The method further includes stripping the second patterned mask and performing an etch to remove the exposed portions of the seed layer, attaching a chip to a second portion of the RDL, and encapsulating the chip and the through vias in an encapsulating material.

According to an embodiment, a method comprises the steps of forming a dielectric layer over a package, the dielectric layer having an opening formed therein and forming a redistribution layer (RDL) over the dielectric layer, the RDL extending into the opening. Forming the RDL includes forming a seed layer, forming a first patterned mask over the seed layer and performing a first metal plating. The method further includes forming through vias on top of a first portion of the RDL, wherein forming the through vias includes forming a second patterned mask, and performing a second metal plating. The method further includes the step of after forming the through vias, stripping the first and second patterned masks and performing an etch to remove the exposed portions of the seed layer, attaching a chip to a second portion of the RDL, and encapsulating the chip and the through vias.

According to an embodiment, a package comprises a first device die, a first encapsulating material encapsulating the first device die therein, a dielectric layer with an opening formed therein positioned over the first device die, a redistribution layer (RDL) extending into the opening and formed over the dielectric layer and a through via positioned over the dielectric layer and in direct contact with the RDL. The package further includes a second device die connected to a portion of the RDL and a second encapsulating material encapsulating the second device die and the through via therein.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a dielectric layer over a package, the dielectric layer having an opening formed therein;
   forming a redistribution layer (RDL) on the dielectric layer and extending into the opening, wherein forming the RDL comprises:
   forming a seed layer,
   forming a first patterned mask over the seed layer, and performing a first metal plating;
   stripping the first patterned mask but leaving the seed layer;
   after stripping the first patterned mask, forming through vias on top of a first portion of the RDL, wherein forming the through vias comprises:
   forming a second patterned mask over the seed layer and the RDL, and
   performing a second metal plating;
   stripping the second patterned mask and performing an etch to remove portions of the seed layer;
   attaching a chip to a second portion of the RDL; and
   encapsulating the chip and the through vias in an encapsulating material.

2. The method of claim 1, wherein encapsulating the chip and the through vias comprises molding the encapsulating material.

3. The method of claim 1, further comprising the step of planarizing the encapsulating material.

4. The method of claim 1, wherein the step of forming the through vias further includes forming the through vias directly on the first portion of the RDL.

5. The method of claim 1, wherein the step of forming the RDL includes forming the RDL over an upper most surface of the dielectric layer.

6. The method of claim 1, wherein the step of forming the through vias includes forming the through vias over an upper most surface of the dielectric layer.

7. The method of claim 1, wherein the step of forming the through via includes the step of forming an aperture extending through a center portion of the through via.

8. A method comprising:
   forming a dielectric layer over a package, the dielectric layer having an opening formed therein;

forming a redistribution layer (RDL) on the dielectric layer, the RDL extending into the opening, wherein forming the RDL comprises:
    forming a seed layer,
    forming a first patterned mask over the seed layer, and performing a first metal plating;
forming through vias on top of a first portion of the RDL, wherein forming the through vias comprises:
    forming a second patterned mask, and
    performing a second metal plating;
after forming the through vias, stripping the first and second patterned masks and performing an etch to remove a portion of the seed layer;
attaching a chip to a second portion of the RDL; and
encapsulating the chip and the through vias.

9. The method of claim 8, further comprising the step of forming an aperture in the through vias and an underlying portion of the RDL, wherein the aperture extends entirely through the through vias and the underlying portion of the RDL.

10. The method of claim 8, wherein the second patterned mask is formed over the first patterned mask.

11. The method of claim 8, wherein the first and second patterned masks are removed by a stripping process.

12. The method of claim 8, wherein the through vias are formed directly on the RDL.

13. The method of claim 8, wherein the step of forming the RDL includes forming the RDL over an upper most surface of the dielectric layer.

14. The method of claim 8, wherein the step of forming the through vias includes forming the through vias over an upper most surface of the dielectric layer.

15. A method comprising:
forming an isolation layer over a first portion of a package, the first portion of the package comprising a first level device die, wherein an opening is formed in the isolation layer, and wherein the opening extends to the first level device die;
forming a redistribution layer (RDL) on the dielectric layer, the RDL extending into the opening and contacting the first level device die, wherein forming the RDL comprises performing a first metal plating according to a first patterned mask;
forming through vias on top of a first portion of the RDL, wherein forming the through vias comprises performing a second metal plating according to a second patterned mask;
after forming the through vias, stripping the first and second patterned masks;
attaching a second level device die to a second portion of the RDL; and
encapsulating the second level device die and the through vias.

16. The method of claim 15, further comprising the step of forming an aperture in the through vias and an underlying portion of the RDL, wherein the aperture extends entirely through the through vias and the underlying portion of the RDL.

17. The method of claim 15, further comprising the step of forming the second patterned mask over the first patterned mask.

18. The method of claim 15, wherein the first and second patterned masks are removed during the same process.

19. The method of claim 15, wherein the through vias are formed directly on the RDL without an adhesive layer therebetween.

* * * * *